United States Patent
Sakamoto et al.

(10) Patent No.: US 6,578,515 B2
(45) Date of Patent: Jun. 17, 2003

(54) FILM FORMATION APPARATUS COMPRISING MOVABLE GAS INTRODUCTION MEMBERS

(75) Inventors: Kiyotoshi Sakamoto, Osaka (JP); Tatsuo Morita, Kyoto (JP)

(73) Assignee: Fuji Daiichi Seisakusho Co., Ltd., Osaka (JP)

( * ) Notice: Subject to any disclaimer, the term of this patent is extended or adjusted under 35 U.S.C. 154(b) by 0 days.

(21) Appl. No.: 09/957,972

(22) Filed: Sep. 20, 2001

(65) Prior Publication Data

US 2002/0069827 A1 Jun. 13, 2002

(30) Foreign Application Priority Data

Sep. 20, 2000 (JP) .................................... 2000-326226

(51) Int. Cl.[7] .............................................. C23C 16/00
(52) U.S. Cl. ................................... 118/723 I; 118/715
(58) Field of Search .................... 118/723 I, 723 IR, 118/723 AN, 715, 723 R, 50.1; 156/345.48, 345.49, 345.29, 345.33, 345.34, 345.37, 345.5

(56) References Cited

U.S. PATENT DOCUMENTS

| | | | | |
|---|---|---|---|---|
| 5,445,699 A | * | 8/1995 | Kamikawa et al. | .... 156/345.24 |
| 5,653,811 A | * | 8/1997 | Chan | ....................... 118/723 I |
| 5,683,548 A | * | 11/1997 | Hartig et al. | ................ 438/729 |

* cited by examiner

Primary Examiner—Luz L. Alejandro

(57) ABSTRACT

A film formation apparatus for plasma CVD and etching methods making use of inductive coupling plasma generators. The apparatus comprises a plurality of plasma generators for inductive coupling methods, one or more film formation gas discharge pipes, and a substrate setting table facing the plurality of plasma generators via a reaction zone. The film formation gas discharge pipes are included in each of two movable members capable of performing reciprocating motions along a substrate surface on the substrate setting table, while intersecting each other. Thereby, a plasma with a relatively high density can be uniformly created over a large area, the film formation gas excited by free radicals in the plasma can uniformly spread over the film formation target, and a film can be formed with a high deposition rate. Consequently, a large-sized substrate with a good quality of thin film can be provided.

9 Claims, 4 Drawing Sheets

FILM FORMATION APPARATUS COMPRISING MOVABLE GAS INTRODUCTION MEMBERS

BACKGROUND OF THE INVENTION (1) Field of the Invention

The present invention relates to a film formation apparatus, and particularly relates to improved technology of a thin film semiconductor manufacturing apparatus in an inductive coupling method, in which a thin film semiconductor is manufactured using a plasma enhanced chemical vapor deposition (plasma CVD) method or a plasma etching method.

(2) Description of the Related Art

Recently, flat panel displays (FPDs) have been widely used and it is desirable that their panels are upsized as their uses are increased. Accompanied by such a situation, it is required to efficiently fabricate good quality of electronic devices (thin film semiconductors) such as thin film transistors (TFTs) on the surface of a large-sized substrate in manufacturing processes of FPDs such as liquid crystal displays (LCDs) or organic EL displays (OELDs).

Among methods for fabricating thin film semiconductors on the large-sized substrate, there are a plasma CVD method and a plasma etching method. In these methods, a plasma is generated in an enclosed space by exciting an excitable gas containing inert gases and then a film formation gas is added, whereby a chemical reaction (gas reaction) is induced so that a thin film is formed on the surface of the substrate.

Here, there are two types of the plasma CVD methods: a capacitive coupling method, and an inductive coupling method.

The capacitive coupling method of the plasma CVD methods is configured so that a substrate setting table and an electrode plate are placed so as to face each other, between which a plasma is generated. Gas reactions are excited by tree radicals and the like generated with the plasma, so that a thin film is deposited on the surface of the substrate placed on the substrate setting table.

In this capacitive coupling method, a scale of plasma is in proportion to the surface area of the electrode plate. Therefore, this method has an advantage that a thin film can be formed on the relatively large area at one time by increasing the size of the electrode plate. However, since the plasma density is not so high and approximately $10^{16}$ m$^{-3}$, a high film formation rate cannot be expected. In addition, the capacitive coupling method is configured so that a plasma spreading over the reaction zone in the apparatus and a substrate are separated from each other by a sheath formed with a self-bias voltage. As such, if positive ions in the plasma are accelerated by the bias voltage and collide with the substrate surface, a uniform film thickness cannot be obtained, which is a serious problem in the method.

In contrast, the inductive coupling method of the plasma CVD methods is configured so that, in one example, a workcoil is wound about a cylindrical-shaped tube, a plasma is generated in the cylindrical-shaped tube by a magnetic field produced by electrically charging the workcoil, and a thin film is formed on the substrate surface by exciting gas reactions with the plasma.

This inductive coupling method has an advantage that a plasma with a high density (ranging from approximately $10^{17}$ to $10^{18}$ m$^{-3}$) and abundant free radicals can be obtained, so that a film formation rate is higher than the capacitive coupling method and the manufacturability of films is excellent. However, this inductive coupling method is generally not suitable for the film formation in a relatively large area due to structural properties of the film formation apparatus. That is, even when a large-sized coil is employed according to the substrate size, a good quality of plasma is difficult to obtain because of a non-uniform distribution of the magnetic density generated by the large-sized coil.

Meanwhile, the plasma etching method is a film formation method, in which a thin film of a desired pattern is formed by allowing radicals generated with plasma to chemically react with a substrate surface to be etched. Here, this plasma may be produced by either the capacitive coupling method or the inductive coupling method as stated above. However, the scale and efficiency of etching considerably depend on the properties of above stated film formation apparatuses, so the current plasma etching method is not regarded as a technique for obtaining a good quality of patterned thin films.

As stated above, it cannot be said that a thin film formation apparatus which forms uniform thin films in a relatively large area has been established.

The film formation techniques such as the plasma CVD method and the plasma etching method are originally used for a fine patterned circuit in a small size substrate to fabricate LSIs and so on, while film formation techniques have not been yet established for large-sized FPDs.

SUMMARY OF THE INVENTION

The object of the present invention is to provide a film formation apparatus in a plasma CVD method and a plasma etching method making use of an inductive coupling method, by which a good quality of thin film can be formed in a large area and at a relatively high rate, as compared with the conventional film formation apparatus.

The above object can be achieved by the film formation apparatus made up of: a plurality of plasma generators; two or more film formation gas discharge means; and a substrate setting means; wherein the plurality of plasma generators are inductive coupling types, the substrate setting means faces the plurality of plasma generators across a reaction zone, and one or more film formation gas discharge means is included in each of two movable members which perform reciprocating motions on axes intersecting each other and parallel to a top surface of a film formation target substrate placed on the substrate setting means.

By means of the above structure, a plasma with a relatively high density can be formed in a large area without nonuniformity and a film formation gas excited by free radicals in the plasma can uniformly spread all over the surface of the film formation target on the substrate, so that a film formation process with a high deposition rate can be realized. As a result, a large-sized substrate on which a good quality of thin film is formed can be provided.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

1. The First Embodiment 1.1 Construction of the Film Formation Apparatus

Figure 1:
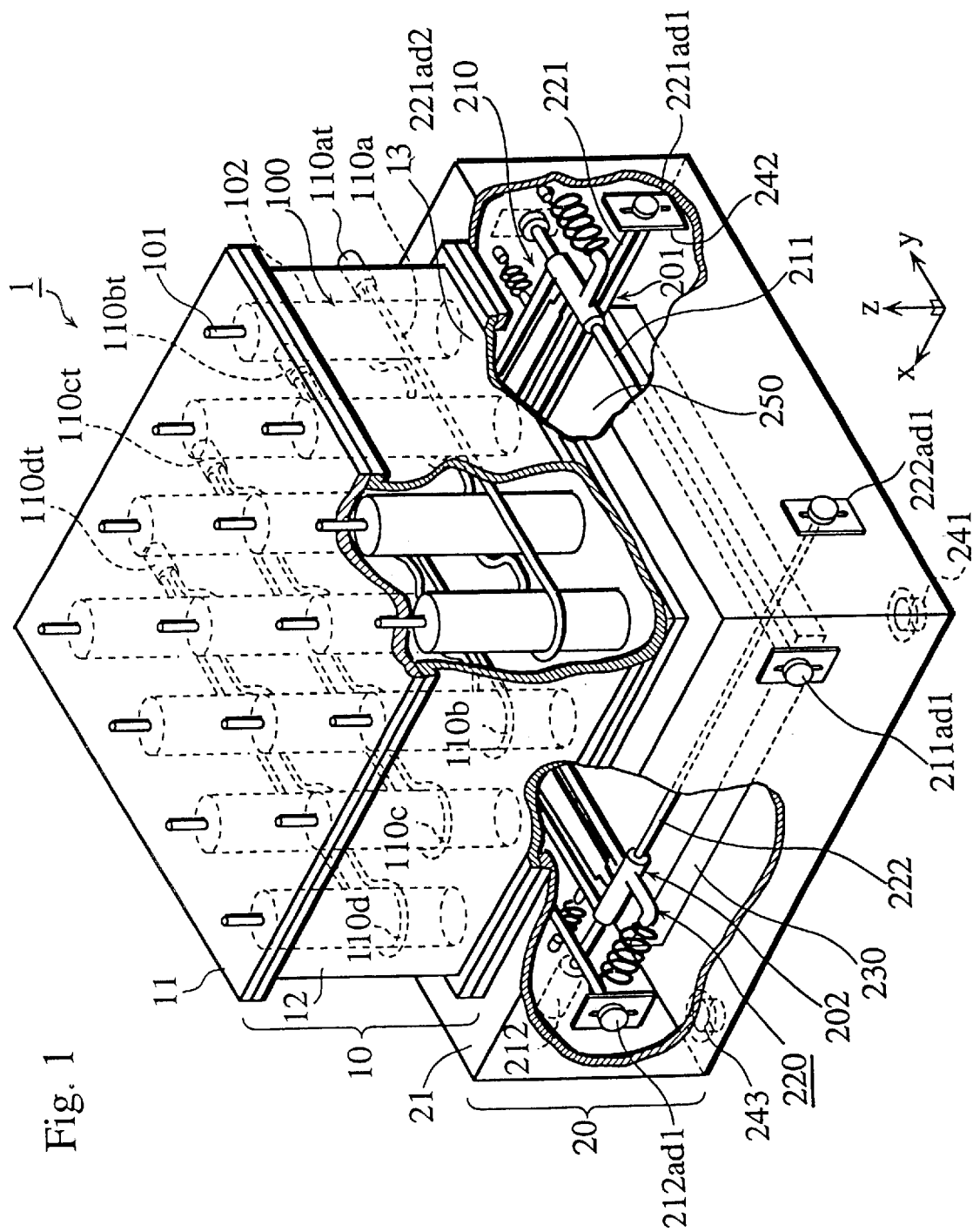
FIG. 1 is a partially cutaway view in perspective of the construction of a film formation apparatus of the present invention.

FIG. 1 is a partially cutaway view in perspective of the construction of a film formation apparatus 1 of the first embodiment of the present invention (hereafter called the "apparatus 1").

FIG. 1 orients the apparatus 1 with reference to a Cartesian chamber reference frame having axes X, Y, and Z. As shown in FIG. 1, the apparatus 1 comprises two main structures: (1) a plasma generation unit 10 including an enclosure box consisting of a top plate 11, a side plate 12, and a bottom plate 13, and (2) a film formation unit 20 having a larger enclosure box than the plasma generation unit 10 and placed under the plasma generation unit 10.

The plasma generation unit 10 has a plasma generator 100 and a plurality of workcoils 110a to 110d built into the enclosure box, while the film formation unit 20 has a substrate setting table 230 and movable units 210 and 220 built into the enclosure box. Their detailed constructions are as follows.

1-2. Construction of the Plasma Generation Unit

The plasma generation unit 10 comprises a plurality of plasma generators 100 arranged in a 4×4 matrix form in the x and y directions respectively, and a plurality of workcoils 110a to 110d, each of which is arranged so as to be wound about four cylindrical tubes 102 of the plasma generators 100 arranged in the y direction.

The plasma generators 100 comprises a plasma excitable gas delivery tube 101 with a diameter of approximately 6.4 mm and a cylindrical quartz tube 102 with a wall thickness of 4 mm and a length of 1 m. The plasma excitable gas delivery tube 101 is arranged so as to penetrate the top plate 11 from the inside of the cylindrical tube 102 and connected to an external inert gas source (not shown), through which a plasma excitable gas (including inert gases, $O_2$, and $H_2$) with a predetermined pressure is supplied. A longer axis of the cylindrical tube 102 is set so as to be perpendicular to the top surface of the substrate setting table 230 (i.e., along the z direction), which will be described later.

Figure 3:
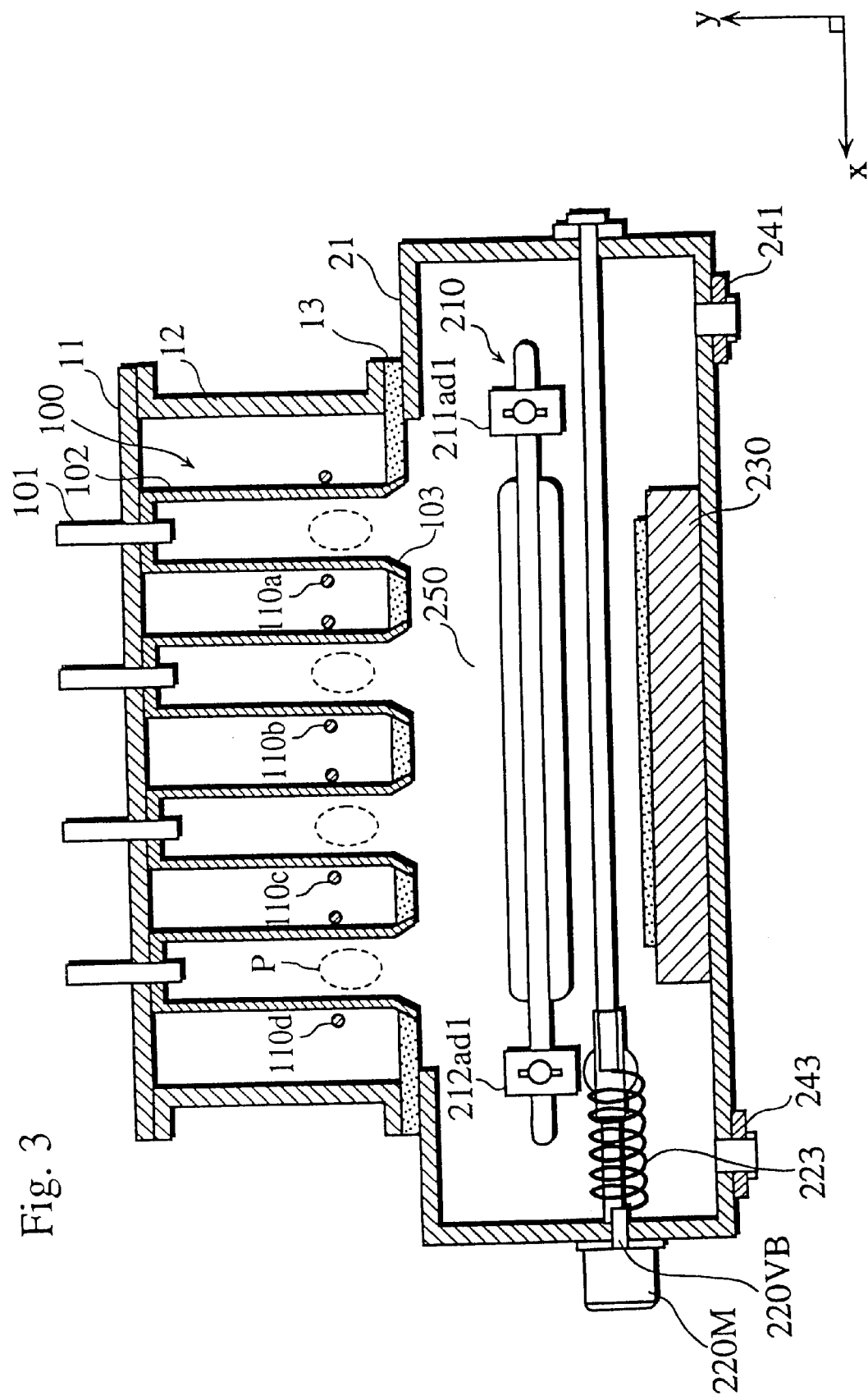
FIG. 3 is a vertical sectional view showing the film formation apparatus of the present invention.

The top outer edge of the cylindrical tube 102 closely contacts with the top plate 11. A diameter of the bottom edge part 103 of the cylindrical tube 102 is configured so as to be larger (=460 mm) than the other parts of the cylindrical tube 102 (=300 mm). In addition, all of the bottom edge parts 103 are integral with the bottom plate 13 (See FIG. 3 showing a vertical sectional view of the apparatus, which will be described later in detail).

Figure 2:
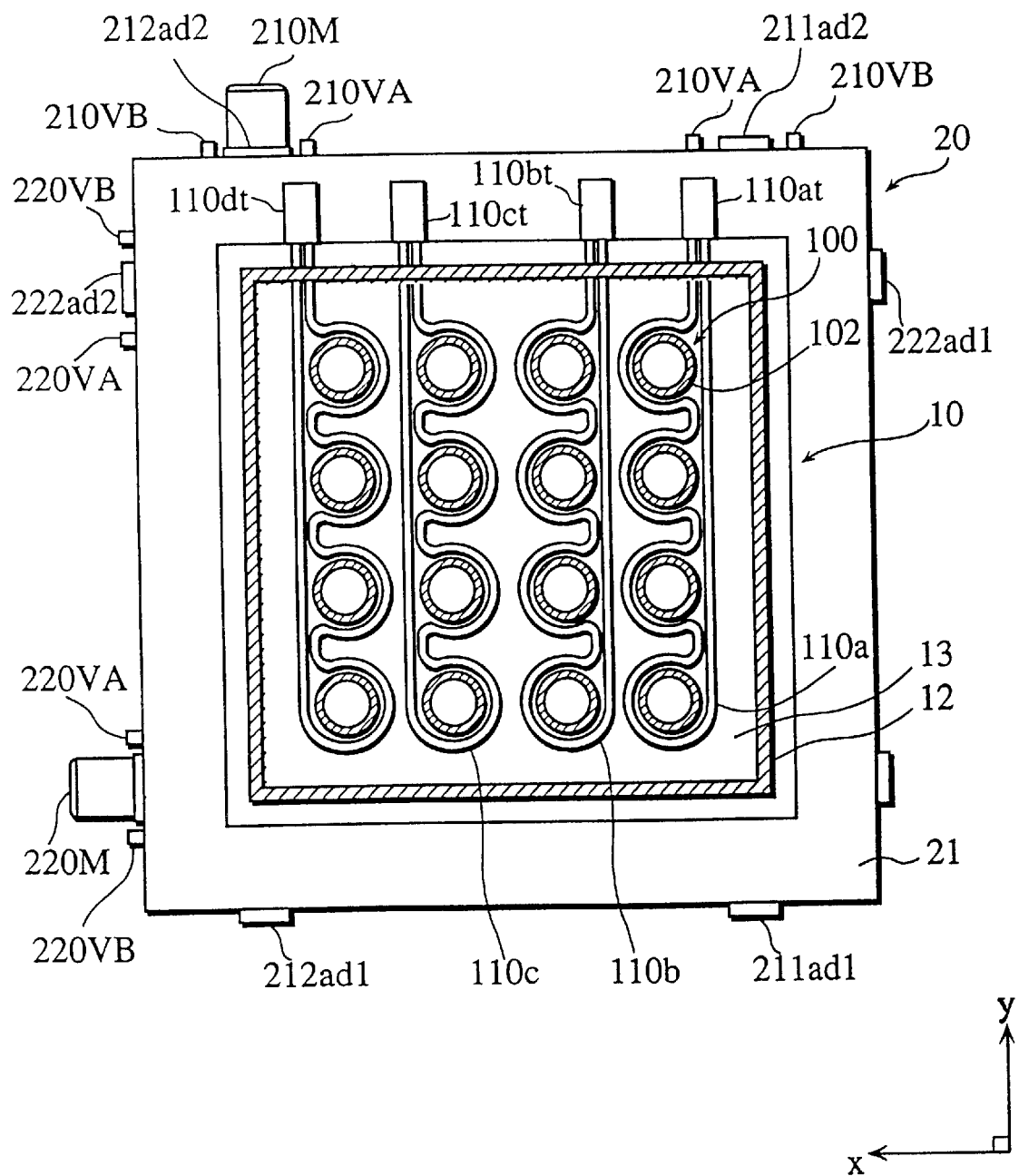
FIG. 2 is a horizontal sectional view showing a plasma generation unit of the film formation apparatus of the present invention.

FIG. 2 shows a sectional view of the plasma generation unit at an X-Y plane.

A workcoil (one of 110a to 110d) is wound around four plasma generators 100 arranged along the y direction, with a fixed interval (approximately 3 mm in one embodiment) from the surface of each cylindrical tube 102. This workcoil is wound around the four plasma generators 100 so as to electrically couple with them, and connected to one of plurality of sockets 110at to 110dt attached to the side plate 12. A predetermined electric power with a predetermined frequency is externally supplied to the sockets 110at to 110dt.

The position of the workcoils 110a to 110d relative to the cylindrical tubes 102 can be changed as required (i.e., a gap between the cylindrical tubes 102 and workcoils 110a to 110d, and a relative position of the cylindrical tubes 102 to the workcoils 110a to 110d in the z direction), whereby the scale of plasma generated in the cylindrical tubes 102 (P regions in FIG. 3) and the generation location can be adjusted.

As shown in FIG. 3, in the apparatus 1, the relative position of the workcoils 110a to 110d is set to be 250 mm above from the bottom edge parts 103 and a distance between the bottom edge parts 103 and the surface of the film formation target placed on the substrate setting table described later is set to be 500 mm. Such a construction prevents unnecessary ions generated with the plasma from doing damage to the surface of the film formation substrate, while enabling selective free radicals such as oxygen radicals which have long lives and are capable of contributing to the film formation to reach to the surface of the film formation target.

1-3. Construction of the Film Formation Unit

As shown in FIG. 1, the film formation unit 20 has a rectangular enclosure box 21, in which the movable units 210 and 220 which are movable in the x and y directions respectively, and a substrate setting table 230 are provided. The movable unit 210 (220) has a unit structure where a movable member 201 (202) performs a reciprocating motion along a pair of guide shafts 211 and 212 (221 and 222) whose longitudinal direction is arranged parallel to the y direction (x direction). In a preferred embodiment of the invention, the movable unit 210 is arranged over (upper in the z direction) the movable unit 220 so as to cross each other without interference between them.

The rectangular-shaped substrate setting table 230 is placed at the undersurface of the enclosure box 21 and adjusted so that the top face of the substrate setting table 230 becomes horizontal, on which a substrate as a film formation target is placed. The substrate is fixed onto the substrate setting table 230 by means of a well-known method, not shown, (for example, a vacuum chuck method). The substrate setting table 230 has a heater (not shown) built into the enclosure box, whereby a substrate can be heated to 600° C.

FIG. 3 is a vertical sectional view of the apparatus 1 along the longitudinal direction of the cylindrical tubes 102. FIG. 3 does not show sectional views of the movable units 210 and 220 for the sake of convenience. As shown in FIG. 3, a reaction zone is formed in a space between the bottom edge part 103 of the plasma generator 100 and the substrate setting table 230.

Figure 4:
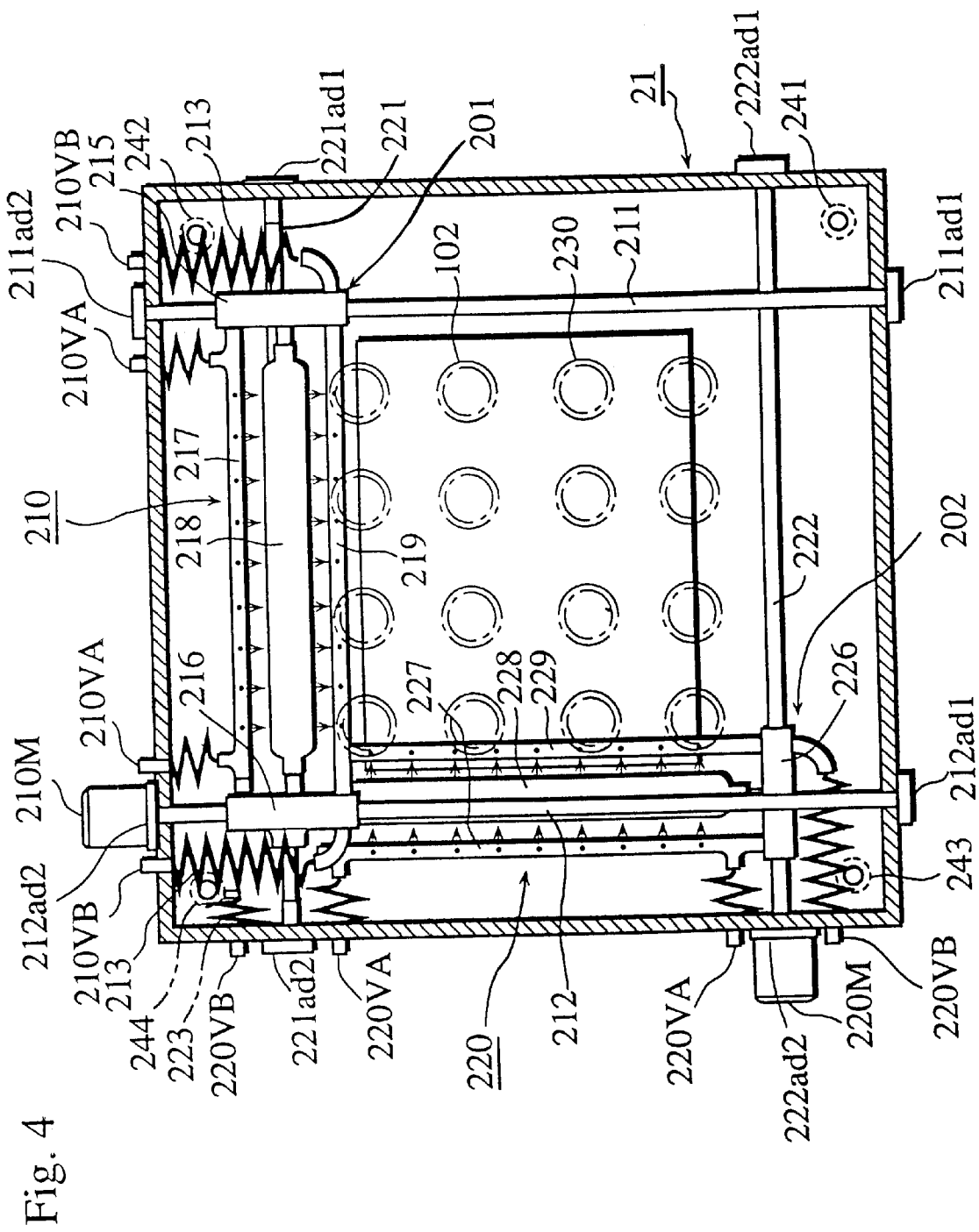
FIG. 4 is a horizontal sectional view showing a film formation unit of the film formation apparatus of the present invention.

FIG. 4 is a sectional view of the film formation unit along the x-y plane.

Each end of a pair of guide shafts 211 and 212 (221 and 222) is supported by and integral with height adjustment units 211ad1 and 211ad2, 212ad1 and 212ad2 (221ad1 and 221ad2, 222ad1 and 222ad2) respectively, whereby the guide shafts 211 and 212 (221 and 222) can be adjusted in the z direction. More specifically, in one embodiment, the guide shafts 211 and 212 are adjusted so that the movable unit 210 (220) is situated 200 mm (100 mm) above from the surface of the film formation target on the substrate placed on the substrate setting table 230.

Among guide shafts 211 and 212 (221 and 222), the surface of the guide shaft 212 (222) is externally threaded, so that the guide shaft 212 (222) is rotatively driven by a servomotor 210M (220M) attached to one side of the guide shaft 212 (222). The externally threaded guide shaft 212 (222) is engaged with a pipe unit 216 (226) (described later) whose internal surface is threaded corresponding to the external threaded portion of the guide shaft 212 (222). Thereby, when the servomotor 210M (220M) is activated, the movable member 201 (202) can precisely perform a reciprocating motion in the y (x) direction along a pair of guide shafts 211 and 212 (221 and 222).

The movable member 201 (202) comprises a pair of pipe units 215 and 216 (225 and 226) through which the guide shafts are passed, a film formation gas discharge pipe 217 (227) arranged so as to be perpendicular to the pair of guide shafts 211 and 212 (221 and 222) and fixed to the pair of pipe units 215 and 216 (225 and 226), a film formation lamp 218 (228), an exhaust tube 219 (229), and so on. These film formation gas discharge pipe 217 (227), film formation lamp 218 (228), and exhaust tube 219 (229) are arranged from the enclosure box 21 in this order as shown in FIG. 4.

The film formation gas discharge pipe 217 (227) is a hollow glass pipe and a plurality of fine openings with a diameter of 0.2 mm are provided in a line along the longitudinal axis with an interval of 5 mm on the surface of the film formation gas discharge pipe 217 (227). Thereby, a film formation gas is jetted through the openings into the reaction zone 250 from the pipe. The fine openings are configured so that a film formation gas is jetted at an incident angle of 45 degrees to the top surface of the substrate setting table 230. This incident angle is adjustable to the other degrees. The film formation gas is supplied to the film formation gas discharge pipe 217 (227) through a valve 210VA (220VA) attached to the enclosure box 21 from the outside, via flexible hoses connected to both ends of the film formation gas discharge pipe 217 (227).

Here, the fine openings with the other, sizes may be arranged in the other arranged manners. In addition, a plurality of film formation gas discharge pipes may be provided in place of the film formation gas discharge pipe 217 (227).

The exhaust tube 219 (229) is a hollow glass pipe having almost the same construction as the film formation gas discharge pipe 217 (227) and serves for exhausting a film formation gas after the film formation reaction (exhaust gas) to the outside of the enclosure box 21. The exhaust gas is sucked through the fine openings of the exhaust tube 219 (229) and exhausted to the outside of the enclosure box 21 through a valve 210VB (220VB) attached to the outside surface of the enclosure box 21, via flexible hoses 213 (223) connected to both ends of the exhaust tube 219 (229).

Here, the driving force for discharging/exhausting gases to/from the film formation gas discharge pipe 217 (227)/ exhaust tube 219 (220) are supplied by a compressor (not shown) so that gases flow with predetermined flow rates.

The film formation lamp 218 (228) radiates light for accelerating a film formation reaction to the substrate setting table 230 (in a preferred embodiment, light whose peak wave-length is 147 nm is employed as an example). Although a xenon lamp is used in this embodiment, the other lamps with desired peak wave-length or a plurality of lamps may be used.

Exhaust holes (conductance valves) 241 to 244 are provided at four corners of the internal undersurface of the enclosure box 21, through which the gas within the enclosure box 21 is exhausted. A turbo-molecular pump (not shown) is connected to the exhaust holes 241 to 244, whereby the flow rate of the exhaust gas and the air pressure in the enclosure box 21 can be adjusted.

1-4. Effects of the Preferred Embodiment in the Invention

Since the inductive coupling method is adopted in the preferred embodiment of the present invention, a plasma with a relatively high density (ranging from approximately $10^{17}$ to $10^{18}$ m$^{-3}$) can be produced, whereby abundant free radicals can be obtained. By means of these abundant free radicals, the film formation gases can chemically react with a higher rate when compared with the capacitive coupling method, so that an excellent film manufacturability can be achieved.

The present invention is to achieve the above stated object. That is, in the conventional film formation apparatuses, when the workcoil increases in size according to the substrate size, there is a problem of non-uniformity of the distribution of magnetic field generated by the workcoil (a doughnut-shaped plasma generates). However, the present invention can avoid the problem.

In addition, using the apparatus in the invention, an excellent plasma can be produced to a large-sized film formation target. Thus, when the plasma etching method applies to the apparatus of the invention, an effective etching operation can be conducted.

In order to achieve the above object, firstly a plurality of plasma generators 100 (4×4 in the x and y directions respectively, 16 pieces in total) in the inductive coupling method are provided, whereby a plasma with a more uniform distribution can be obtained with plasma generators 100. As a result, a plasma with high density can be produced when compared with the capacitive coupling method.

Secondly, since a film formation gas discharge means moves all over the surface of the film formation target, a film formation condition with reduced non-uniformity and a film formation process with a high deposition rate can be realized.

Thirdly, a distance between the plasma generators 100 and the substrate, and a relative position of the cylindrical tubes 102 of the plasma generators 100 to the workcoils are adjustable, so that free radicals generated with the plasma which have long lives can selectively contribute to the film formation reaction. Such a construction prevents unnecessary ions generated with the plasma from doing damage to the surface of the film formation substrate, so that an excellent film whose surface does not have an unevenness can be formed. Therefore, the apparatus 1 of the present invention can realize the film surface whose level of evenness is within 10%.

2. Embodiments

The following describes confirmed effects of the apparatus 1 according to the above stated embodiments.

2-1. Embodiment 1 (Plasma CVD Method)

Experimental conditions for the embodiment 1 are as follows:

Film formation area in the substrate: 550 mm×670 mm

Plasma excitable gas: mixed gas of Ar and $O_2$, mixture ratio (by volume) 3:1, Ar gas flow rate: 30 sccm $O_2$ gas flow rate: 10 sccm internal pressure: 150 mTorr RF current: frequency: 100 MHz, RF power: 600 W Film formation gas: $SiH_4$, flow rate: 5 sccm Film formation lamp: not operated Exhaust gas flow rate is adjusted according to the film formation rate and generating conditions of particles.

Moving speed of the movable members: 100 mm/sec

According to the above experimental conditions, when the apparatus 1 is activated, air filled in the apparatus is exhausted through the exhaust holes 241 to 244 at first. Then, the plasma excitable gas is introduced into the apparatus through the plasma excitable gas delivery tube 101 and the RF power is applied to the workcoils. As a result, a plasma in an H mode is generated vertically in the area with 80 mm length from the region in the vicinity of the workcoils along the z direction.

Here, the distance between the plasma and the substrate is set so that unnecessary ions do not damage the film formation surface, by adjusting a relative position of workcoils to the cylindrical tubes 102 in the z directions Thus, $O_2$ radicals having relatively long lives can reach from the plasma to the substrate setting table with a higher priority than the other kinds of radicals. The substrate setting table heats a substrate so that the temperature of the substrate surface is kept to 400° C. by the operation of the internal heater.

In the above state, $SiH_4$ gas as a film formation gas filled in the film formation gas discharge pipe 217 (227) is jetted into the reaction zone 250 through the fine openings. Then, $SiH_4$ molecules included in the film formation gas are decomposed by the $O_2$ radicals generated with the plasma into $SiO_2$, and these $SiO_2$ molecules are deposited onto the surface of the film formation target in the substrate. The exhaust gas after the film formation reaction is sucked through the fine openings of the exhaust tube 219 (229) and exhausted through a valve 210VB (220VB) attached to the enclosure box 21 to the outside, via flexible hoses 213 (223) connected to both ends of the exhaust tube 219 (229).

In this state, when movable members 201 and 202 perform a reciprocating motion 10 times, perpendicularly intersecting each other, an $SiO_2$ film whose average film thickness is 750 Å and with reduced damages is formed on the surface of the film formation target in the substrate. In this $SiO_2$ film, the difference between the maximum and minimum values of the film thickness is within ±5%. It takes approximately 15 min to deposit the film on the large-sized substrate (550 mm×670 mm). Actually, an OH density contained in the $SiO_2$ film can be reduced to 50 ppb or less by this method, so that large-sized substrates for FPDs such as current-driven type organic EL devices, on which high-reliability pixel transistors are fabricated, can be formed.

As stated above, a film with an adequate film thickness can be speedily formed on the large-sized substrate by means of the embodiment 1.

2-2. Embodiment 2 (Plasma CVD Method)

Experimental conditions for the embodiment 2 are as follows:

Film formation area in the substrate: 550 mm×670 mm

Plasma excitable gas: mixed gas of Ar and $H_2$, mixture ratio: 1:3, Ar gas flow rate: 10 sccm $H_2$ gas flow rate: 30 sccm internal pressure: 50 mTorr Film formation lamp: light exposure using a Xe lump with a peak wave-length of 147 nm RF current: frequency: 70 MHz, RF power: 1 kW Film formation gas: $SiH_4$, flow rate: 5 sccm Exhaust gas flow rate is adjusted according to the film formation rate.

Moving speed of the movable members: 100 mm/sec

According to the above stated experimental conditions, when movable members 201 and 202 perform a reciprocating motion 15 times, perpendicularly intersecting each other, $SiH_4$ molecules included in the film formation gas are decomposed by the Ar and $H_2$ radicals generated with the plasma, so that a polycrystalline Si film whose average film thickness is 100 nm is formed on the surface of the film formation target in the substrate. In this polycrystalline Si film, the particle diameter of crystals is 0.7 μm on average and the difference between the maximum and minimum values of the film thickness is within ±10%. Here, the particle diameter of the polycrystalline Si can be increased to 1 μm.

In this embodiment 2, almost the same effects as in the embodiment 1 can be obtained.

2-3. Embodiment 3 (Plasma Etching Method)

Experimental conditions for the embodiment 3 are as follows:

Etched target film: $SiO_2$ film

Film formation area in the substrate: 550 mm×670 mm

Plasma excitable gas: $CF_4$ (flow rate: 10 sccm internal pressure: 10 mTorr)

Film formation lamp: not operated

RF current: frequency: 70 MHz, RF power: 400 W

Film formation gas: not used

Exhaust gas flow rate is adjusted according to the film formation rate.

Movable units are not moved.

According to the above stated experimental conditions, $CF_4$ molecules are decomposed in the plasma and a lot of F radicals are generated, so that the $SiO_2$ film can be etched with an excellent rate. Since ions generated with the plasma do not collide against the target in this etching process, the target can be etched excellently in the relatively large area.

3. Others

The film formation apparatus of the present invention may be used when organic LEDs and the like are fabricated. More specifically, a transparent electrode (ITO) film is formed on the surface of the substrate, and the surface of this film is processed using $O_2$ radicals by the film formation apparatus according to the invention.

Alternatively, the film formation apparatus according to the invention may be incorporated into a well-known multi-chamber system.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A film formation apparatus, comprising:

a plurality of plasma generators;

two or more first film formation gas discharge means; and a substrate setting means;

wherein the plurality of plasma generators are inductive coupling plasma generators, the substrate setting means faces the plurality of plasma generators across a reaction zone, and one or more second film formation gas discharge means are included in each of two movable members which perform reciprocating motions on axes intersecting each other and parallel to a top surface of a film formation target substrate placed on the substrate setting means.

2. The film formation apparatus of claim 1, wherein each of the plurality of plasma generators, further comprises:

a cylindrical tube; and a workcoil, wherein the workcoil is wound around the cylindrical tube.

3. The film formation apparatus of claim 2,
wherein the diameter of one end of each of the cylindrical tubes facing the reaction zone is larger than the diameter of the other end.

4. The film formation apparatus of claim 2,
wherein the axis of each of the cylindrical tubes is perpendicular to the surface of the film formation target substrate placed on the substrate setting means.

5. The film formation apparatus of claim 1,
wherein the two movable members move on axes perpendicularly intersecting each other.

6. The film formation apparatus of claim 1,
wherein each of the second film formation gas discharge means includes one or more pipe units having a plurality of film formation gas injection nozzles.

7. The film formation apparatus of claim 1,
wherein each of the two movable members includes an exhaust gas suction means.

8. The film formation apparatus of claim 7,
wherein each of the two movable members includes a lamp for the second film formation reaction, placed between the second film formation gas discharge means and the exhaust gas suction means.

9. The film formation apparatus of claim 8,
wherein a film formation gas discharged from the second film formation gas discharge means is $SiH_4$ gas,
and a peak wavelength of the lamp for film formation reaction is 147 nm.

* * * * *